(12) United States Patent
Hsu

(10) Patent No.: US 6,885,252 B2
(45) Date of Patent: Apr. 26, 2005

(54) CLOCK RECOVERY CIRCUIT CAPABLE OF AUTOMATICALLY ADJUSTING FREQUENCY RANGE OF A VCO

(75) Inventor: Jason Hsu, Hsinchu (TW)

(73) Assignee: Mediatex Inc., Hsin Chu (TW)

( * ) Notice: Subject to any disclaimer, the term of this patent is extended or adjusted under 35 U.S.C. 154(b) by 0 days.

(21) Appl. No.: 10/190,585

(22) Filed: Jul. 9, 2002

(65) Prior Publication Data

US 2004/0008087 A1 Jan. 15, 2004

(51) Int. Cl.$^7$ .............................................. H03L 7/087
(52) U.S. Cl. ............................ 331/17; 331/14; 327/156
(58) Field of Search ............................. 331/34, 17, 1 A, 331/45, 11, 14, 173, DIG. 2, 57; 327/156–159, 147–150; 375/373–376

(56) References Cited

U.S. PATENT DOCUMENTS

| | | | | |
|---|---|---|---|---|
| 4,612,516 A | * | 9/1986 | Defeuilley et al. | 331/11 |
| 5,268,654 A | * | 12/1993 | Furutani et al. | 331/10 |
| 5,334,952 A | * | 8/1994 | Maddy et al. | 331/1 A |
| 5,363,419 A | * | 11/1994 | Ho | 375/376 |
| 5,942,949 A | * | 8/1999 | Wilson et al. | 331/17 |
| 5,955,928 A | | 9/1999 | Smith et al. | 331/2 |
| 6,163,224 A | * | 12/2000 | Araki et al. | 331/34 |
| 6,181,211 B1 | * | 1/2001 | Aho et al. | 331/11 |
| 6,288,583 B1 | * | 9/2001 | Ozawa et al. | 327/113 |

* cited by examiner

*Primary Examiner*—Minh Nguyen
(74) *Attorney, Agent, or Firm*—Birch, Stewart, Kolasch & Birch, LLP

(57) ABSTRACT

A clock recovery circuit capable of automatically adjusting the frequency range of a voltage-controlled oscillator (VCO). The clock recovery circuit includes a phase detector, a charge pump, a loop filter, a voltage-controlled oscillator, a frequency counter, and a frequency control unit. The phase detector receives an input signal, such as EFM clock, and a VCO clock and outputs a control signal according to phase differences between the EFM clock and the VCO clock. The charge pump controls the charge action according to the control signal. The loop filter is connected to the charge pump and outputs a voltage signal. The voltage-controlled oscillator receives the voltage signal from the loop filter and outputs the VCO clock. The frequency counter counts the frequency of the VCO clock and outputs an oscillation frequency. The frequency control unit receives the oscillation frequency, sets a frequency value according to the oscillation frequency, and outputs a control voltage to the voltage-controlled oscillator.

8 Claims, 4 Drawing Sheets

CLOCK RECOVERY CIRCUIT CAPABLE OF AUTOMATICALLY ADJUSTING FREQUENCY RANGE OF A VCO

BACKGROUND OF THE INVENTION

1. Field of the Invention

The invention relates to a clock recovery circuit, and in particular to an EFM clock recovery circuit capable of automatically adjusting the frequency range of a voltage-controlled oscillator.

2. Description of the Related Art

In general, if an optical disc is rotated in a constant angle speed by an optical disk drive, the linear speeds at the inner and outer tracks of the optical disc are different. Under this condition, the frequencies of the EFM (Eight To Fourteen Modulation) signals at the different tracks read by the optical disk drive are not the same. In order to correctly read the information at different zones (tracks) of the optical disc, the optical disk drive has to adopt a clock recovery circuit (or a phase-locked loop circuit) to generate clocks in synchronization with the EFM signals.

FIG. 1 shows a typical EFM clock recovery circuit. The clock recovery circuit 100 includes a phase detector 101, a frequency detector 102, a charge pump 103 connected to the phase detector 101 and the frequency detector 102, a loop filter 104 connected to the charge pump 103, a voltage-controlled oscillator (hereinafter referred to as VCO) 107 for receiving the control voltage VT of the loop filter 104, and a frequency divider 106 for dividing the frequency of the clock FCO outputted from the VCO 107. Since the functions of the clock recovery circuit 100, phase detector 101, frequency detector 102, charge pump 103, loop filter 104, VCO 107 and frequency divider 106 are the same as those of a typical phase-locked loop (PLL) circuit, detailed descriptions thereof are omitted. In addition, the clock recovery circuit 100 further includes a digital-analog converter (hereinafter referred to as DAC) 105. The DAC 105 converts data outputted from the look-up table 105' into an analog voltage RVT according to the data that is to be read by the optical disk drive and corresponds to the zone of the optical disc. Then, the analog voltage RVT is outputted to the VCO 107 so as to control the frequency range of the VCO 107. The look-up table 105' is controlled by a control signal, thereby outputting data corresponding to the zone of the optical disc.

However, the clock recovery circuit 100 as shown in FIG. 1 has some drawbacks. First, if the pickup head of the optical disk drive moves to an incorrect zone, the DAC 105 cannot be updated to correct data. Thus, the VCO 107 may be saturated because the optical disk drive cannot read correct addresses. Under this condition, the optical disk drive has to be reset. Second, since the look-up table 105' only records the relationship between the zones and frequencies, the tuning voltage VT varies with the speed variation of the spindle motor when the speed of the spindle motor of the optical disk drive becomes unstable. However, the output from the DAC 105 will never change and the VCO 107 will thus be saturated.

SUMMARY OF THE INVENTION

In view of the above-mentioned problems, it is therefore an object of the invention to provide an EFM clock recovery circuit with a function of automatically adjusting the frequency range of the voltage-controlled oscillator for automatically adjusting the control voltage.

The invention provides an EFM clock recovery circuit with a function of automatically adjusting the frequency range of a voltage-controlled oscillator (VCO). The EFM clock recovery circuit includes a phase frequency detector, a charge pump, a loop filter, a VCO, a frequency counter, and a frequency control unit. The phase frequency detector receives an EFM clock and a VCO clock and outputs a control signal according to differences of phase and frequency between the EFM clock and the VCO clock. The charge pump receives the control signal outputted from the phase frequency detector and controls the charge action according to the control signal. The loop filter is connected to the charge pump and cooperates with the charge pump to output a voltage signal. The VCO receives the voltage signal from the loop filter and outputs the VCO clock. The frequency counter counts the frequency of the VCO clock and outputs an oscillation frequency. The frequency control unit receives the oscillation frequency, sets a frequency value according to the oscillation frequency, and outputs a control voltage to the voltage-controlled oscillator.

In the clock recovery circuit stated above, the frequency control unit may increase the frequency value when a difference value obtained by subtracting the frequency value from the oscillation frequency is greater than a predetermined frequency range.

Alternatively, the frequency control unit may decrease the frequency value when a difference value obtained by subtracting the oscillation frequency from the frequency value is greater than the predetermined frequency range.

BRIEF DESCRIPTION OF THE DRAWINGS

These and other objects and advantages of the present invention will become apparent by reference to the following description and accompanying drawings wherein.

DETAILED DESCRIPTION OF THE INVENTION

Figure 1:
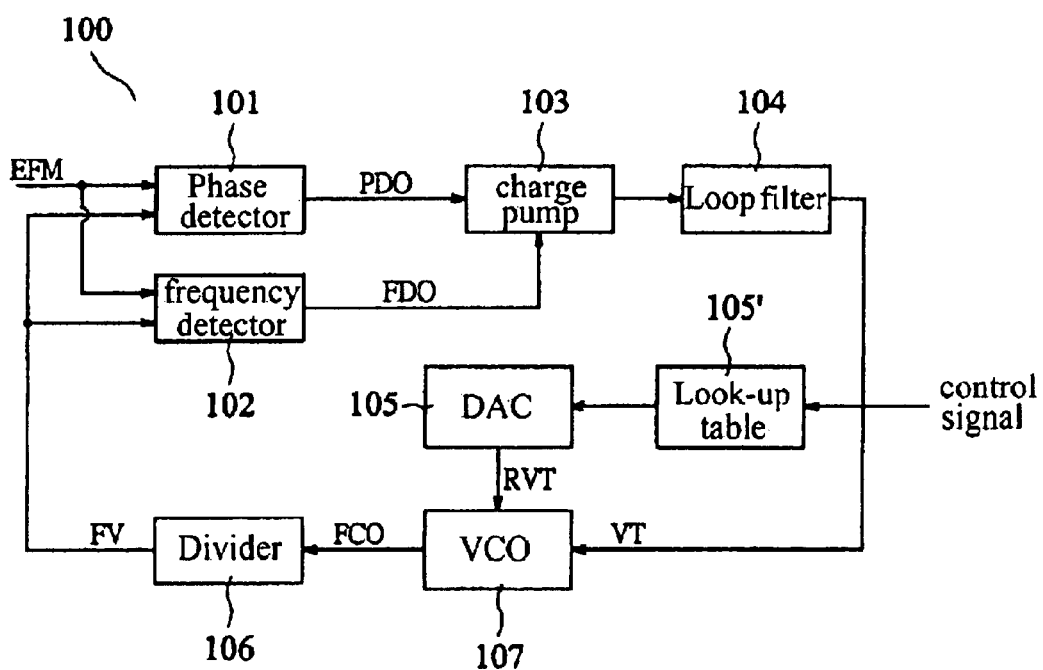
FIG. 1 is a block diagram showing an EFM clock recovery circuit using a conventional look-up table to control the VCO oscillation frequency.
Figure 2:
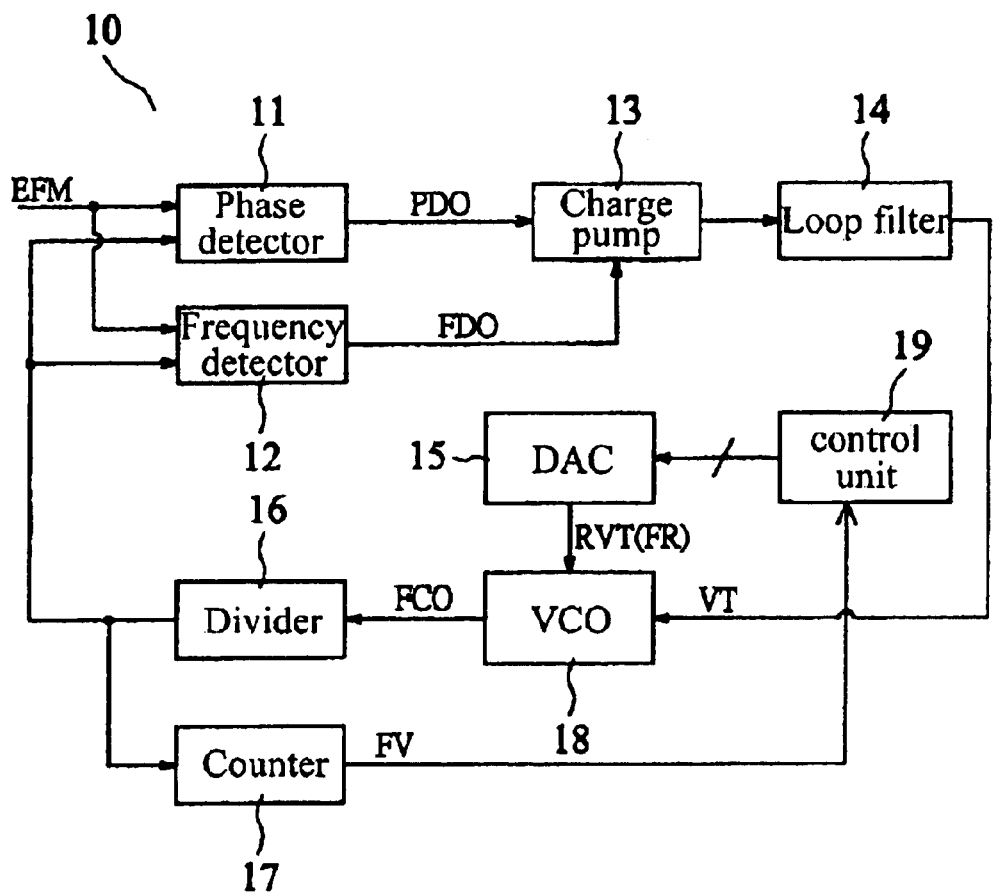
FIG. 2 is a block diagram showing an EFM clock recovery circuit of the invention capable of automatically adjusting the frequency range of the voltage-controlled oscillator.

FIG. 2 is a block diagram showing the EFM clock recovery circuit of the invention capable of automatically adjusting the frequency range of the voltage-controlled oscillator. Referring to FIG. 2, the EFM clock recovery circuit 10 of the present invention includes a phase detector 11, a frequency detector 12, a charge pump 13, a loop filter 14, a VCO 18, and a frequency divider 16. The operations and functions of the above-mentioned elements are the same as those in the conventional clock recovery circuit (as shown in FIG. 1), and detailed descriptions thereof are thus omitted. The EFM clock recovery circuit 10 further includes a frequency counter 17 for counting the frequency of the output clock from the frequency divider 16, and a frequency control unit 19 for controlling the clock oscillation range of the VCO 18.

The frequency control unit 19 is connected to the frequency counter 17 and adjusts the oscillation frequency of the VCO 18 according to the output frequency value FV of the frequency counter 17. If the output signal from the frequency control unit 19 is a digital signal, the digital-analog converter (DAC) 15 may convert the digital signal into an analog voltage signal RVT, which is then outputted to the VCO 18. If the output signal from the frequency control unit 19 is an analog voltage signal, it may be directly outputted to the VCO 18. The frequency control unit 19 receives the output frequency value FV of the frequency counter 17 and compares the difference value between the frequency value FV and the frequency value FR. If the difference value is greater than a predetermined frequency range, such as ΔF, the frequency value FR is adjusted upwards or downwards such that the VCO 18 may operate within the linear range. Therefore, it is possible to prevent the VCO 18 from saturation, thereby ensuring the output clock in synchronization with the EFM signal.

Figure 3:
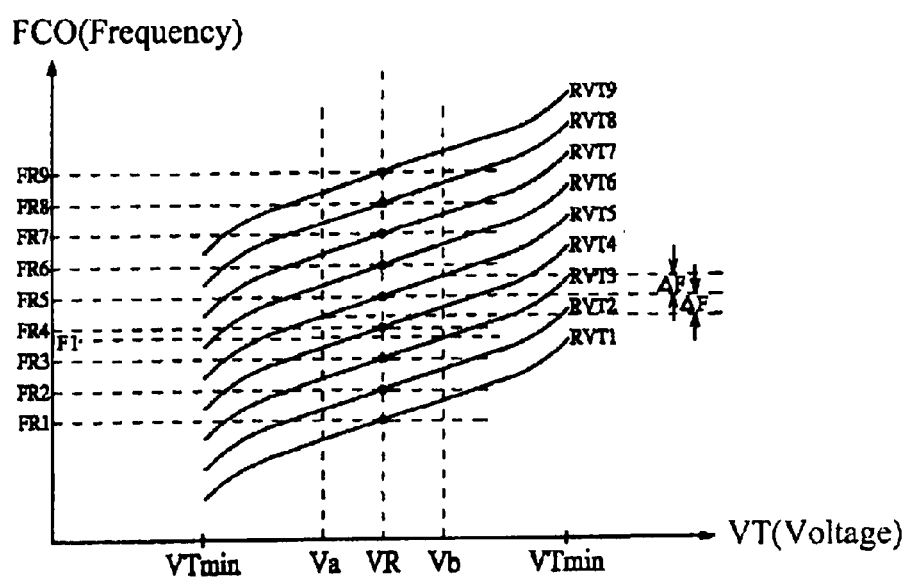
FIG. 3 is a graph showing the relationship between the frequency and the control voltage when the clock recovery circuit of FIG. 2 is used to adjust the frequency.

FIG. 3 is a graph showing the relationship among the oscillation frequency FCO of the VCO 18, the output voltage VT of the loop filter 14, and the output voltage RVT of the DAC 15. The curves shown in this graph illustrate the relationship between VT and FCO with respect to various output voltages RVT. Each curve varies linearly within the center zone between Va and Vb but varies non-linearly at two end zones. In order to ensure the normal operation of the VCO 18, it is preferred to make the VCO 18 operate within the linear zone.

As shown in FIG. 3, nine frequency variation ranges are illustrated in this embodiment. Of course, the frequency variation range may be adjusted according to the requirement of the practical design. The curves correspond to nine different RVTn (i.e., RVT1 to RVT9) and to nine different center frequencies FRn (i.e., FR1 to FR9), respectively. These center frequencies FRn can be obtained by setting control voltage VT with VR value and counting the oscillating frequency. It is preferred that the difference values between any two adjacent center frequencies FR are the same. Therefore, as long as the frequency control unit 19 detects that the difference value between the output frequency FV from the frequency counter 17 and the currently-set center frequency FR is greater than a frequency value ΔF, the control unit 19 adjusts the frequency variation range upwards or downwards by a level from the center frequency FR, thereby achieving the object of automatically adjusting the frequency output range of the VCO 18. The ΔF as shown in FIG. 3 is preferably a little greater than one half of the difference value between two adjacent center frequencies, for example, ΔF>(FR6−FR5)/2. The ΔV is the voltage difference of the control voltage needed for the VCO 18 to generate two adjacent center frequencies, i.e., ΔV=RVT6−RVT5. Therefore, the control voltage of VCO 18 may always be controlled at the optimum value.

Figure 4:
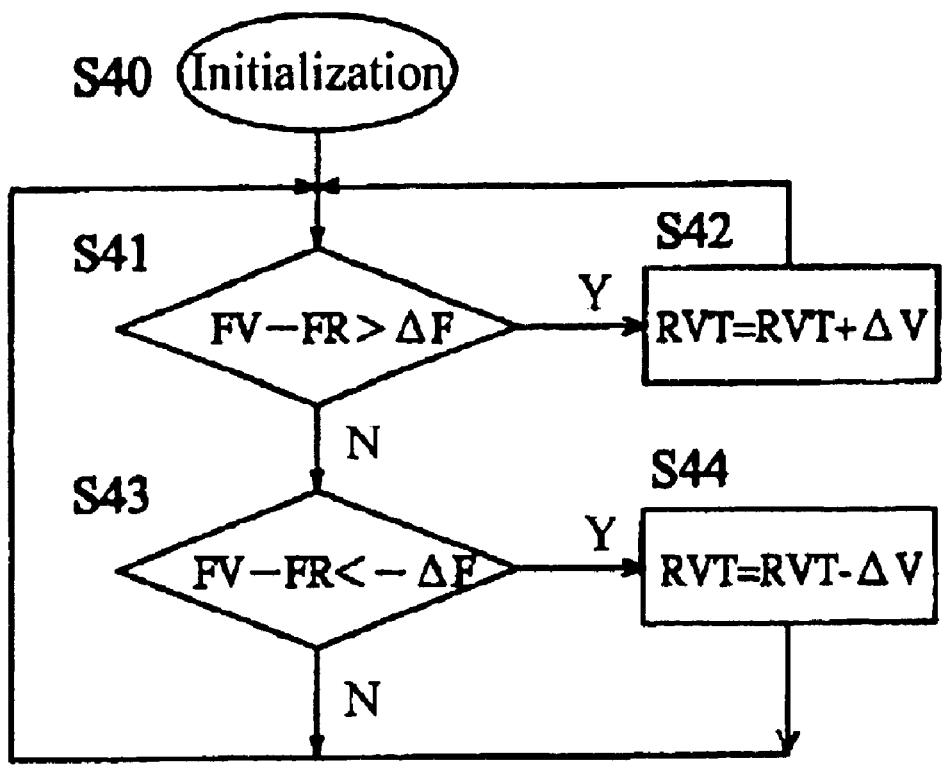
FIG. 4 shows the control flow of the frequency control unit of the invention.

FIG. 4 shows a flow chart of the invention for controlling the frequency output range of VCO 18 in order to illustrate the control method of the frequency control unit 19. The steps are to be described as follows.

Step S40 is performed to initiate the setting. That is, the center frequency FR of the initial frequency output range is set. Since the pickup head may read the data at the inner tracks of the optical disc and the frequency of the EFM signal is low, the initialization setting may set the initial frequency range to be the lowest frequency range, for example, FR=FR1.

Step S41 is performed to compare the output frequency FV from the frequency counter 17 with the currently-set center frequency FR, and to judge whether the difference value between the two frequencies FV and FR is greater than the frequency value ΔF. If FV−FR>ΔF, the process goes to step S42 to adjust the FR upwards. Otherwise, the process goes to step S43.

Step S42 is performed to adjust FR upwards. That is, the RVT is increased by ΔV(RVT=RVT+ΔV). Then, the process goes to step S41.

Step S43 is performed to compare the output frequency FV from the frequency counter 17 with the currently-set center frequency FR, and to judge whether the difference value between the two frequencies FV and FR is smaller than the frequency value −ΔF. If FV−FR<−ΔF, the process goes to step S44 to adjust the FR downwards. Otherwise, the process goes to step S41 to continue the detection.

Step S44 is performed to adjust the FR downwards. That is, the RVT is lowered by a range (RVT=RVT−ΔV). Then, the process goes to step S41.

Consequently, the invention may control the clock output range of the VCO 18 within the linear zone according to the above-mentioned steps so as to correctly output the clock in synchronization with the EFM signal.

Another embodiment for the control unit is to directly find a nearest frequency FRn and update the corresponding RVT value. For example, as shown in FIG. 3, if the frequency f1 is the frequency outputted by the frequency counter, the FR4 would be found to be the nearest frequency FRn. Thus, the control unit will update the analog voltage RVT by the RVT4 and a linear operating voltage VT can be obtained. In this manner, a look-up table for finding the nearest frequency FRn can be applied.

While certain exemplary embodiments have been described and shown in the accompanying drawings it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A clock recovery circuit capable of automatically adjusting a central frequency of a voltage-controlled oscillator, comprising:

a phase detector for receiving an input signal and a VCO clock and outputting a control signal according to phase difference between the input signal and the VCO clock;

a charge pump for controlling charge action according to the control signal outputted from the phase detector;

a loop filter connected to the charge pump and in cooperation with the charge pump to output a voltage signal;

a voltage-controlled oscillator for receiving the voltage signal from the loop filter and a control voltage for controlling the central frequency and outputting the VCO clock according to both the voltage signal and the control voltage;

a frequency counter for receiving the VCO clock, counting the frequency of the VCO clock and outputting an oscillation frequency value; and a frequency control unit for receiving the oscillation frequency value, setting an updated central frequency value according to the oscillation frequency value and a current central frequency value, and outputting the control voltage corresponding to the updated central frequency value to the voltage-controlled oscillator, so that the central frequency of the voltage-controlled oscillator is automatically adjusted in an online manner, such that the updated central frequency value is closer to the frequency of the VCO clock than the current central frequency value.

2. The clock recovery circuit according to claim 1, wherein the frequency control unit further comprises a digital-analog converter for converting the control voltage from a digital format to an analogue format.

3. The clock recovery circuit according to claim 2, wherein the frequency control unit increases the current central frequency value and updates the control voltage to a value associated with the increased current central frequency value when a difference value obtained by subtracting the current central frequency value from the oscillation frequency value is greater than a threshold.

4. The clock recovery circuit according to claim 3, wherein the difference of two adjacent central frequency values available in the frequency control unit is a constant, and the threshold is substantially greater than half of the difference.

5. The clock recovery circuit according to claim 2, wherein the frequency control unit decreases the current central frequency value and updates the control voltage to a value associated with the decreased current central frequency value when a difference value obtained by subtracting the oscillation frequency value from the current central frequency value is greater than a threshold.

6. The clock recovery circuit according to claim 5, wherein the difference of two adjacent central frequency values available in the frequency control unit is a constant, and the threshold is substantially greater than half of the difference.

7. The clock recovery circuit according to claim 1, further comprising a frequency divider for frequency-dividing the VCO clock outputted from the voltage-controlled oscillator.

8. A clock recovery circuit capable of automatically adjusting a central frequency of a voltage-controlled oscillator, comprising:

a phase detector for receiving an input signal and a VCO clock and outputting a control signal according to the phase difference between the input signal and the VCO clock;

a charge pump for controlling charge action according to the control signal outputted from the phase detector;

a loop filter connected to the charge pump and in cooperation with the charge pump to output a voltage signal;

a voltage-controlled oscillator for receiving the voltage signal from the loop filter and a control voltage for controlling the central frequency and outputting the VCO clock according to both the voltage signal and the control voltage;

a frequency counter for receiving the VCO clock, counting the frequency of the VCO clock and outputting an oscillation frequency value; and a frequency control unit for receiving the oscillation frequency value, setting an updated central frequency value according to the oscillation frequency value and a current central frequency value, and outputting the control voltage associated with the updated central frequency value to the voltage-controlled oscillator, so that the central frequency of the voltage-controlled oscillator is automatically adjusted in an online manner, such that the updated central frequency value is closer to the frequency of the VCO clock than the current central frequency value;

wherein the frequency control unit updates the central frequency value by selecting a center frequency value from a set of available center frequency values such that the selected central frequency value is closest to the frequency of the VCO clock and comprises a converter for converting the updated central frequency value into the control voltage for outputting to the voltage-controlled oscillator.

* * * * *

UNITED STATES PATENT AND TRADEMARK OFFICE
CERTIFICATE OF CORRECTION

PATENT NO. : 6,885,252 B2
DATED : April 26, 2005
INVENTOR(S) : Jason Hsu

It is certified that error appears in the above-identified patent and that said Letters Patent is hereby corrected as shown below:

<u>Title page,</u>
Item [73], Assignee, please change "Mediatex Inc." to -- Mediatek Inc. -- .

Signed and Sealed this

Twenty-third Day of August, 2005

JON W. DUDAS
*Director of the United States Patent and Trademark Office*